United States Patent [19]
Kashiwagi et al.

[11] Patent Number: 5,579,572
[45] Date of Patent: Dec. 3, 1996

[54] APPARATUS FOR MOUNTING ELECTRONIC PARTS AND A METHOD THEREOF

[75] Inventors: Yasuhiro Kashiwagi, Maebaru; Masayuki Higashi, Chikushino, both of Japan

[73] Assignee: Matsushita Electric Industrial Co., Ltd., Osaka, Japan

[21] Appl. No.: 375,781

[22] Filed: Jan. 20, 1995

[30] Foreign Application Priority Data

Jan. 25, 1994 [JP] Japan ................................. 6-006332

[51] Int. Cl.⁶ ........................................................ H05K 3/30
[52] U.S. Cl. ........................... 29/836; 29/740; 29/741; 29/743; 29/DIG. 44; 414/752
[58] Field of Search ............................. 29/739, 740, 741, 29/743, 834, 836, DIG. 44; 156/567; 414/737, 738, 752

[56] References Cited

U.S. PATENT DOCUMENTS

| | | | |
|---|---|---|---|
| 4,372,802 | 2/1983 | Harigane et al. | 414/752 X |
| 4,704,792 | 11/1987 | Itagaki et al. | 29/741 |
| 4,905,370 | 3/1990 | Hineno et al. | 29/740 |
| 4,985,986 | 1/1991 | Fritsch | 29/743 X |
| 5,033,185 | 7/1991 | Hidese | 29/740 |
| 5,165,165 | 11/1992 | Aoki et al. | 29/741 X |

FOREIGN PATENT DOCUMENTS

| | | | |
|---|---|---|---|
| 1273388 | 11/1989 | Japan | 29/739 |
| 4094598 | 3/1992 | Japan | 29/743 |
| 4162499 | 6/1992 | Japan | 29/743 |

*Primary Examiner*—Peter Vo
*Attorney, Agent, or Firm*—Ratner & Prestia

[57] ABSTRACT

A mounting apparatus mounts electronic parts on a substrate. The mounting apparatus includes an electronic part feeder having a moving table which moves along a moving path. The moving table moves a part cassette accommodating electronic parts to a pick up station. A transferring and mounting unit having a transferring and mounting head is also provided to move between the pick up station and the mounting station to retrieve the electronic part from a part pick up port of the part cassette at the pick up station. The transferring and mounting head has a nozzle for picking up an electronic part. The transferring and mounting head rotates the nozzle along a circular path. The moving path and the circular path intersect at two points at the pick up station. The pick up port of the part cassette is positioned at one of the intersecting points.

5 Claims, 6 Drawing Sheets

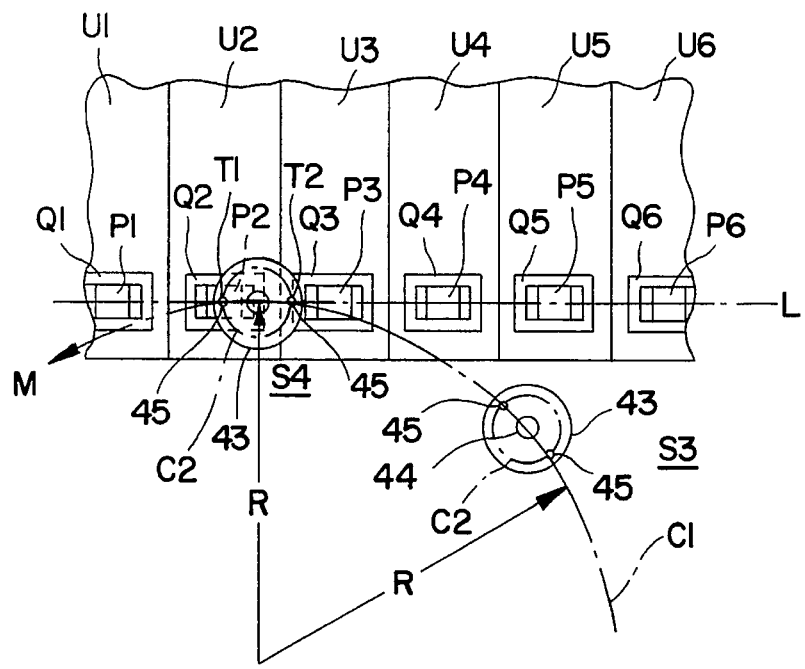
FIG. 6
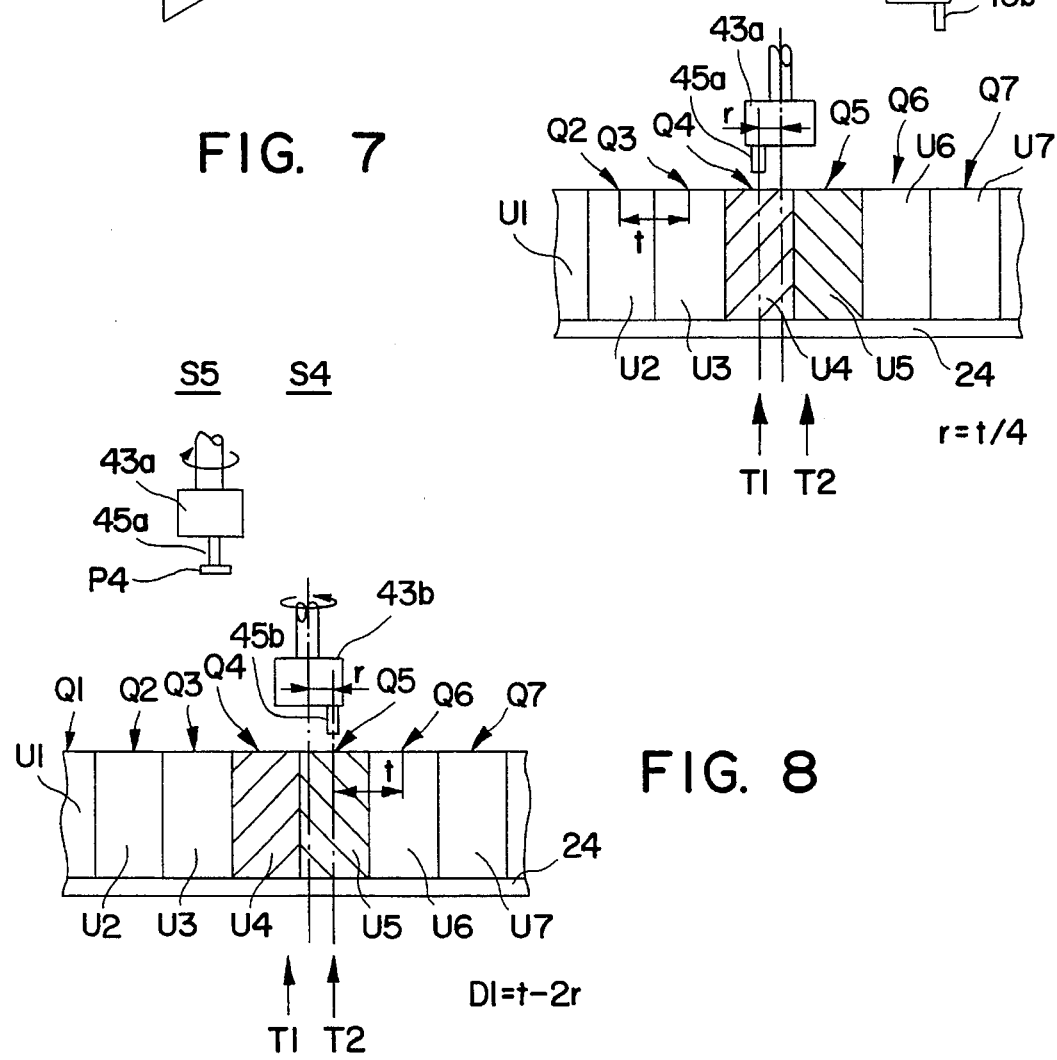
FIG. 7
FIG. 8

| SEQUENCE NUMBER | UNIT NUMBER | STOP POSITION DATA |
|---|---|---|
| 1 | U1 | T1 |
| 2 | U2 | T2 |
| 3 | U2 | T1 |
| 4 | U2 | T1 |
| 5 | U3 | T2 |
| 6 | U3 | T2 |
| 7 | U3 | T1 |
FIG. 9
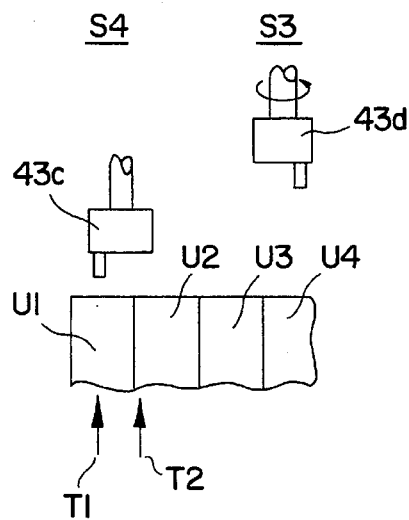
FIG. 10(a)
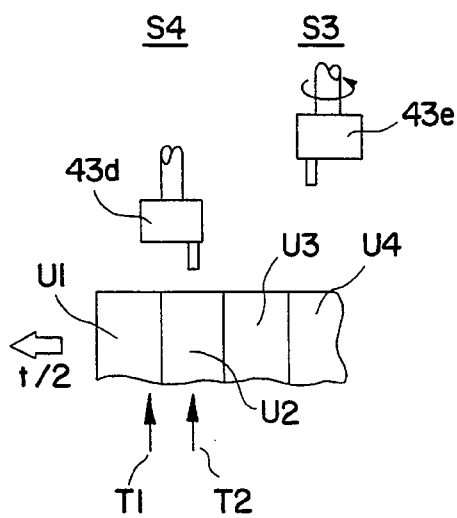
FIG. 10(b)

APPARATUS FOR MOUNTING ELECTRONIC PARTS AND A METHOD THEREOF

FIELD OF THE INVENTION

The present invention relates to an apparatus and method for mounting electronic parts on a substrate.

BACKGROUND OF THE INVENTION

Some conventional apparatuses for mounting electronic parts include part cassettes for holding electronic parts which are carried on a moving table. The moving table is moved along a straight path to a predetermined pick up station where an electronic part is removed from the part cassette. Then the electronic part is mounted onto a substrate.

In order to increase the mounting speed of the electronic parts on the substrate, the speed of the transferring and mounting units for transferring and mounting electronic parts have been increased. In conventional apparatuses for mounting electronic parts, however, the speed of the units for feeding electronic parts, such as the moving table which positions a desired part cassette at a pick up station, is not as fast as the transferring and mounting units.

FIG. 11 and FIG. 12 illustrate the operation of a conventional apparatus for mounting electronic parts. In FIGS. 11 and 12, a plurality of part cassettes U1, U2, . . . , U8 accommodating respectively different types of parts are placed at pitches of 't' on a moving table 101. When a transferring and mounting head 102 is caused to come to a fixed stop at position 104 by the transferring and mounting unit, an electronic part is removed using nozzle 103 attached under the transferring and mounting head 102. As shown in FIG. 11, the electronic part is removed from the cassette U4 positioned at stop position 104.

Next, if an electronic part is to be removed from part cassette U5 using transferring and mounting head 102, as shown in FIG. 12, moving table 101 must move immediately in the X direction a moving distance of D0 to position the part cassette U5 at stop position 104.

In the conventional apparatus above, when the transferring distance D0 is large, or the moving table 101 is slow, the moving table 101 often does not complete its movement to the position shown in FIG. 12 by the time the transferring and mounting electronic unit completes one cycle.

Accordingly, the transferring and mounting electronic unit has to wait until the moving table 101 completes the determined movement, or skip the step. Accordingly, even if the transferring and mounting electronic unit operates at a high speed to improve the mounting speed, the operation speed of the apparatus may be limited due to the operation of moving table 101.

SUMMARY OF THE INVENTION

The present invention relates to an apparatus for mounting electronic parts at high speed by reducing time associated with moving the moving table. The present invention further relates to an apparatus for mounting electronic parts including:

(1) means for feeding a substrate to a mounting station;

(2) means for feeding an electronic part from one of a plurality of part cassettes positioned on a moving table which moves along a moving path by transferring a pick up port of one of the plurality of part cassettes to a pick up station;

(3) transferring and mounting head means having a nozzle for retrieving the electronic part where the transferring and mounting head means rotates about an axis of rotation causing the nozzle to rotate along a circular path about the axis of rotation;

(4) means for rotating the transferring and mounting head means;

(5) means for (a) transferring the electronic part from the pick up port of the electronic part cassette positioned at said pick up station to a mounting station, (b) mounting the electronic part, and (c) positioning the transferring and mounting head at the pick up station so the circular path and the moving path intersect at two points; and (6) means for causing the means for feeding the electronic part to stop the pick up port of the part cassette at one of the two intersecting points and for rotating the transferring and mounting head to position the nozzle above the desired pick up port.

The mounting method of the exemplary embodiment of the present invention includes the steps of:

(1) moving a moving table carrying part cassettes accommodating electronic parts along a moving path, and stopping a pick up port of the first part cassette accommodating a desired first electronic part at a first stop position of a pick up station, the pick up station having the first stop position and a second stop position;

(2) transferring a first nozzle coupled to a first transferring and mounting head to a position corresponding to the first stop position by rotating the first transferring and mounting head about an axis of rotation so the first nozzle rotates along a substantially circular path, and picking up the desired electronic part using the first nozzle from the pick up port of the first part cassette;

(3) moving the first transferring and mounting head carrying the first electronic part to a mounting station;

(4) mounting the first electronic part transferred to the mounting station onto a desired substrate positioned at the mounting station;

(5) moving the moving table carrying a second part cassette accommodating a second electronic part along a moving path, and stopping the pick up port of the second part cassette at the second stop position;

(6) rotating a second transferring and mounting head having a second nozzle about the axis of rotation to move the second nozzle to a position corresponding to the second stop position, and picking up the second electronic part from the pick up port of the second part cassette using the second nozzle;

(7) transferring the second transferring and mounting head carrying the second electronic part to said mounting station; and (8) mounting the second electronic part on a desired substrate positioned at the mounting station;

where the circular path and the moving path intersect at the first stop position and the second stop position.

According to the exemplary apparatus and method of the present invention, one of the two intersection points near the pick up port of the next part cassette can be selected. Thus, the moving distance of the moving table is shortened resulting in substantially reduced moving time. As a result, the operational speed of the mounting apparatus can be improved.

BRIEF DESCRIPTION OF THE DRAWINGS

FIG. 6 is a enlarged fragmentary plane view of the mounting apparatus for electronic parts according to an exemplary embodiment of the present invention.

FIG. 7 is an illustrative view of the operation of the mounting apparatus for electronic parts according to exemplary embodiment of the present invention.

FIG. 8 is an illustrative view of the operation of the mounting apparatus for electronic parts according to exemplary embodiment of the present invention.

FIG. 9 is a data table used in the mounting apparatus for electronic parts according to the exemplary embodiment of the present invention.

FIGS. 10(a), 10(b), and 10(c) are illustrative views of the operation of the mounting apparatus for electronic parts according to an exemplary embodiment of the present invention.

DESCRIPTION OF PREFERRED EMBODIMENTS

Figure 1:
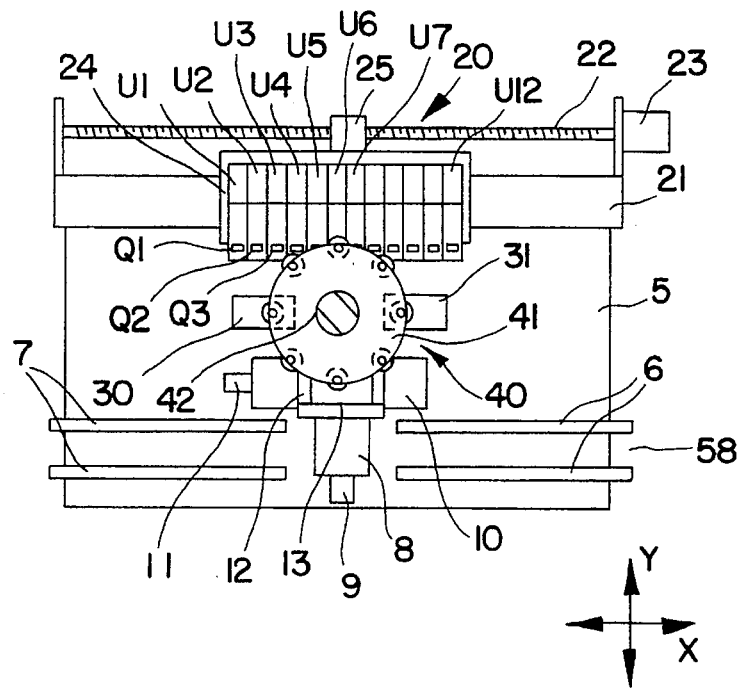
FIG. 1 is a top view of a mounting apparatus for electronic parts of an exemplary embodiment of the present invention.
Figure 2:
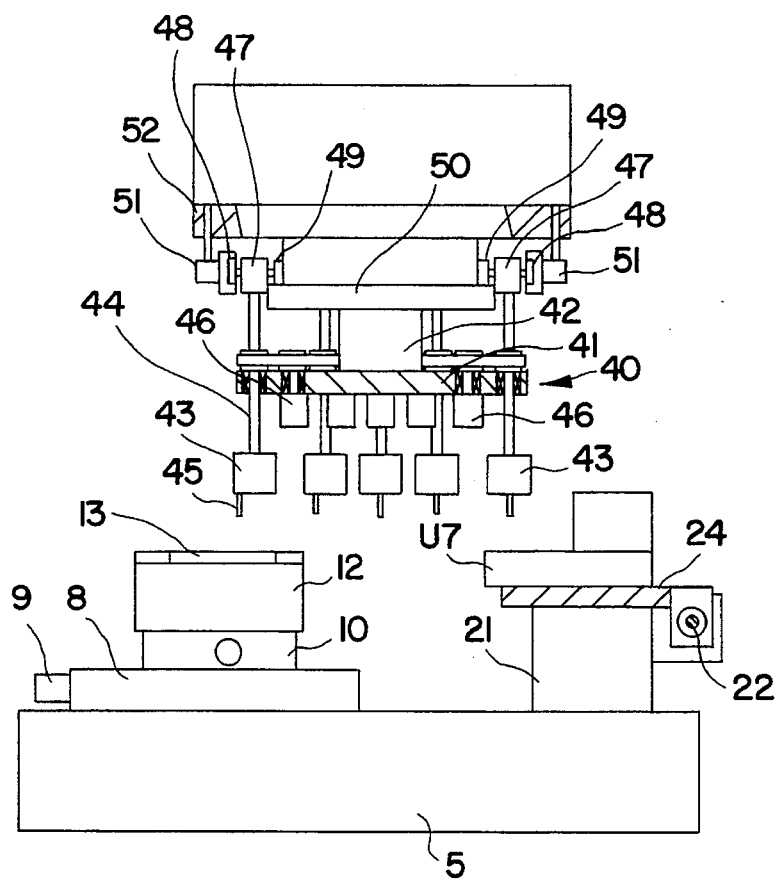
FIG. 2 is a sectional view of the mounting apparatus for electronic parts of the exemplary embodiment of the present invention.
Figure 3:
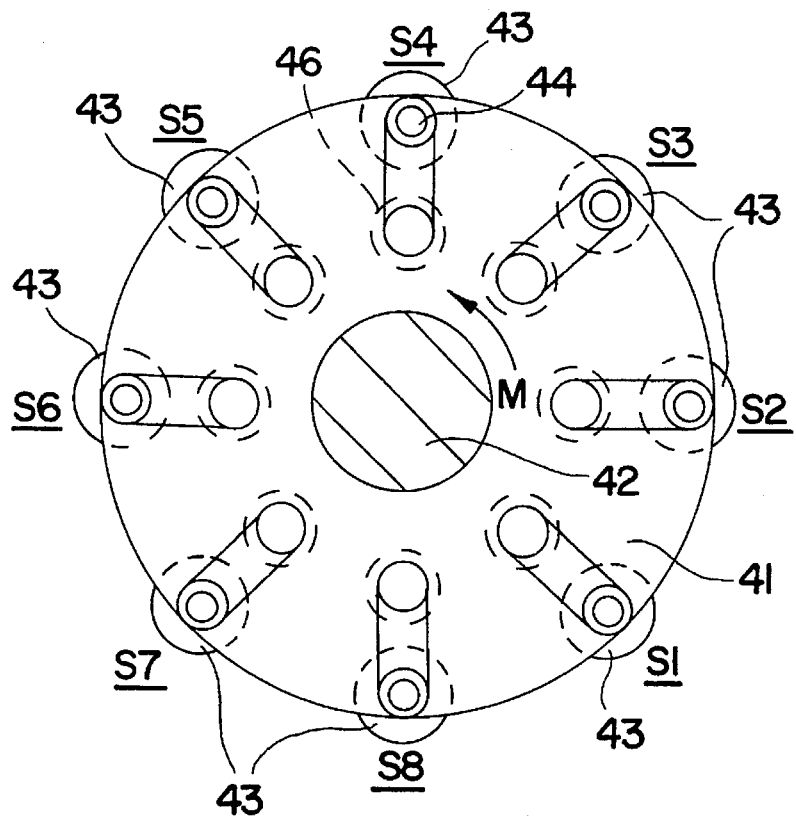
FIG. 3 is a plane view of a rotary plate of the mounting apparatus according to the exemplary embodiment of the present invention.

FIG. 1 is a top view of a mounting apparatus for electronic parts according to an exemplary embodiment of the present invention. FIG. 2 is a sectional view of the mounting apparatus for electronic parts shown in FIG. 1. FIG. 3 is a plane view of a rotary plate of the mounting apparatus shown in FIG. 1.

The mounting apparatus for electronic parts shown in FIG. 1 and FIG. 2 comprises a base 5, a substrate feeder 58, an electronic part feeder 20, a transferring and mounting unit for electronic part 40, and a control means (not shown). The electronic part feeder 20 is installed on the rear surface of base 5. The substrate feeder 58 is installed on a front surface of base 5. The transferring and mounting unit of electronic part 40 is installed above the central part of base 5.

Base 5 is used as a working table for mounting an electronic part onto a substrate 13. Provided at specific positions on base 5 are a pick up station S4, shown in FIG. 3, for picking up a desired electronic part and mounting station S8, shown in FIG. 3, for mounting the electronic part onto a substrate 13. The substrate feeder 58 moves substrate 13 to mounting station S8 and a previous substrate to the next process.

In FIG. 1, mounting station S8 is on the front surface of base 5, and a conveyer 6 for providing substrate 13 and a conveyer 7 for removing substrate 13 are provided on each side of mounting station S8.

A Y table 8 driven by a Y motor 9 is installed on the front center surface of base 5. Y table 8 is installed an X table 10 driven by motor 11. On X table 10 a holder 12 for holding substrate 13 is also installed. By driving Y motor 9 and X motor 11, substrate 13 provided by conveyer 6 is received by holder 12 and transferred to mounting station S8. The desired electronic part is mounted onto substrate 13 at mounting station S8. Substrate 13 mounted with the electronic part is transferred to conveyer 7 which removes substrate 13 from the apparatus.

The electronic part feeder 20 provides the electronic part to be mounted on substrate 13. Electronic part feeder 20 includes a rail base 21 fixed on the rear part of base 5 and a feed screw 22 rotatably supported by rail base 21. A motor 23 is projectively mounted on moving table 24 engaging slidably with rail base 21 to rotate feed screw 22. Moving table 24 is moved in the X direction by moving feed nut 25 which engages with feed screw 22 in the X direction. Moving table 24 is provided with part cassettes U1, U2, ... U12 which respectively accommodate different kinds of electronic parts. The part cassettes have pick up ports Q1, Q2, ... Q12. The electronic parts are retrieved from pick up ports Q1, Q2, ... Q12 and transferred under pick up station S4 shown in FIG. 3.

A recognition unit 30 and a nozzle selection unit 31 are arranged between (1) the conveyer 6 or conveyer 7 and (2) electronic part feeder 20 and facing each other.

Next, transferring and mounting unit 40 for transferring and mounting an electronic part will be illustrated with reference to FIG. 1, FIG. 2, FIG. 3, and FIG. 4.

Transferring and mounting unit 40 retrieves an electronic part from the electronic part feeder 20 and mounts the retrieved electronic part onto substrate 13. Transferring and mounting unit 40 includes a disc like rotary plate 41 and a plurality of transferring and mounting heads 43 arranged on the circumference of rotary plate 41 at equal intervals. Each transferring and mounting head 43 circulates with an index rotation in the following order of: (1) substrate 13, (2) nozzle selection unit 31, (3) electronic part feeder 20, and (4) recognition unit 30. Each transferring and mounting head 43 picks up an electronic part from the specific cassette and mounts the electronic part onto substrate 13.

Transferring and mounting heads 43 located on the circumference of rotary plate 41 circulate to each station, to be described later, by index rotation of rotary shaft 42 provided at the center of rotary plate 41. Rotary plate 41 is disk-like.

A head rotating shaft 44 is fixed on each of the transferring and mounting heads 43.

Head rotating shaft 44 is moveable upward and downward and rotatable with respect to rotary plate 41.

As shown in FIG. 6, head rotating shafts 44 are arranged in equal intervals on a circle C1 whose center is at the rotation axis of rotary plate 41. As rotary plate 41 rotates, head rotating shaft 44 moves along circle C1 having a radius R in the direction of the arrow.

Transferring and mounting heads 43 have a plurality of nozzles 45 which have different figures or structures which are mounted underneath transferring and mounting heads 43 in eccentric positions with respect to head rotating shaft 44. The figures or structures of nozzles 45 correspond to the desired electronic parts to be picked up.

The plurality of nozzles 45 are arranged on a rotation circle C2, shown in FIG. 6, whose center is at the rotation center of transferring and mounting head 43 where the head rotating shaft 44 attaches to transferring and mounting head 43. A desired nozzle corresponding to the electronic part to be picked up is selected from the plurality of nozzles.

Each of the plurality of nozzles 45 can be ejected downward from and accommodated within transferring and mounting head 43, when it picks an electric part. Only a selected nozzle 45 is ejected downward while the other nozzles 45 not used are accommodated within transferring and mounting head 43. A desired electronic part is picked by the selected nozzle 45.

Head motor 46 is used for rotating head rotating shaft 44. The rotary shaft of head motor 46 is connected to head rotating shaft 44 through timing pulleys and a timing belt. When head motor 46 is driven, as shown in FIG. 6, nozzle 45 moves along rotating circle C2, so, the attitude of transferring and mounting head 43 or the angle of the electronic part picked by the nozzle 45 can be adjusted.

As shown in FIG. 3, the transferring and mounting head 43 circulates around rotary shaft 42 of rotary plate 41 successively in the direction from spare station S1 to nozzle selecting station S2 for selecting the type of nozzle 45 to pre-pick up station S3 for adjusting the attitude of the transferring and mounting head 43 as described later, to pick up station S4 for picking up the electronic part from the electronic part feeder 20 to detecting station S5 for detecting if a missed pick up occurred by the nozzle 45 to recognition station S6 for checking the attitude of the electronic part to detect a deviation of the position or angle from the ideal position to angle compensating station S7 for adjusting the angle deviation detected at recognition station S6 to mounting station S8 for mounting the electronic part onto substrate 13.

As shown in FIG. 2, the upper part of head rotating shaft 44 of transferring and mounting head 43 is rotatably connected with block 47. A cam follower 48 and a cam follower 49 are equipped at both sides of block 47.

Figure 4:
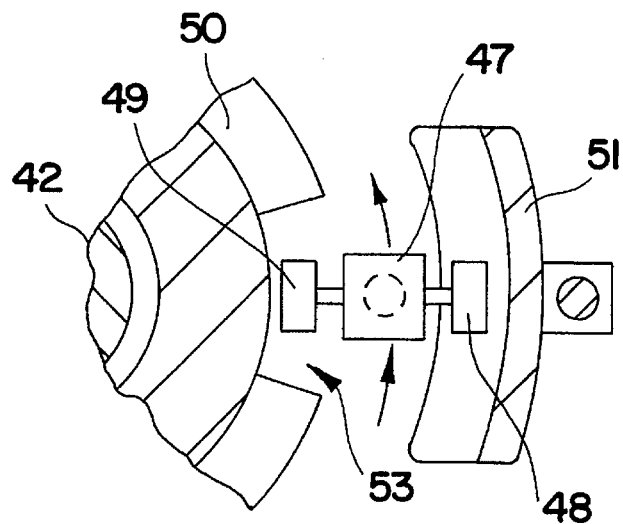
FIG. 4 is an enlarged fragmentary view of the rotary plate shown in FIG. 3.

Cam follower 49 moves while in contact with cam surface of cylindrical cam 50 which does not rotate, as shown in FIG. 4. Notches 53 are formed at positions corresponding to pick up station S4 and mounting station S8 on the cam surface of cylindrical cam 50. At the positions facing notches 53, are provided cam receivers 51 for supporting cam followers 48. Cam receivers 51 are moved up and down by a driving means not shown.

Each cam follower 48 is moved to pick up station S4 and mounting station S8 by the index rotation of rotary plate 41 and rests on the cam receivers 51.

The cam followers 49 are rotated on the cam surface of cylindrical cam 50 to notches 53. Then, cam receiver 51 is moved downward with respect to top plate 52 by the driving means (not shown) at pick up station S4 or mounting station S8. As a result, nozzle 45 moves up and down toward substrate 13 or electronic part feeder 20 so that an electronic part is picked up at pick up station S4, and mounted at mounting station S8.

In FIG. 6, each of pick up ports Q1, Q2, . . . Q6 of part cassettes U1, U2, . . . U6 is moved along moving path L by moving table 24 laterally. Each electronic part P1, P2, . . . P6 are respectively accommodated in part cassettes U1, U2, . . . U6. At pick up station S4, rotation circle C2 of transferring and mounting head 43 and moving path L intersect each other at two points, a first stop position T1 and a second stop position T2. In the exemplary embodiment, electronic part feeder 20 and transferring and mounting unit 40 are arranged so that moving path L and the center of the rotation circle C2 nearly coincide.

When an electronic part is picked up from the part cassette accommodating a desired electronic part, the part cassette is stopped at first stop position T1 or second stop position T2 by moving table 24.

Nozzle 45 is moved to the position above one of the stop positions where the part cassette accommodating the desired electronic part P to be picked up by transferring and mounting head 43 is positioned by driving head motor 46 to rotate the transferring and mounting head 43 at the pre-pick up station S3.

When the pick up port of the electronic part of the part cassette and the position of the nozzle 45 coincide at pick up station S4, transferring and mounting head 43 is moved downward to pick up the electronic part which is kept at the tip of nozzle 45.

Figure 5:
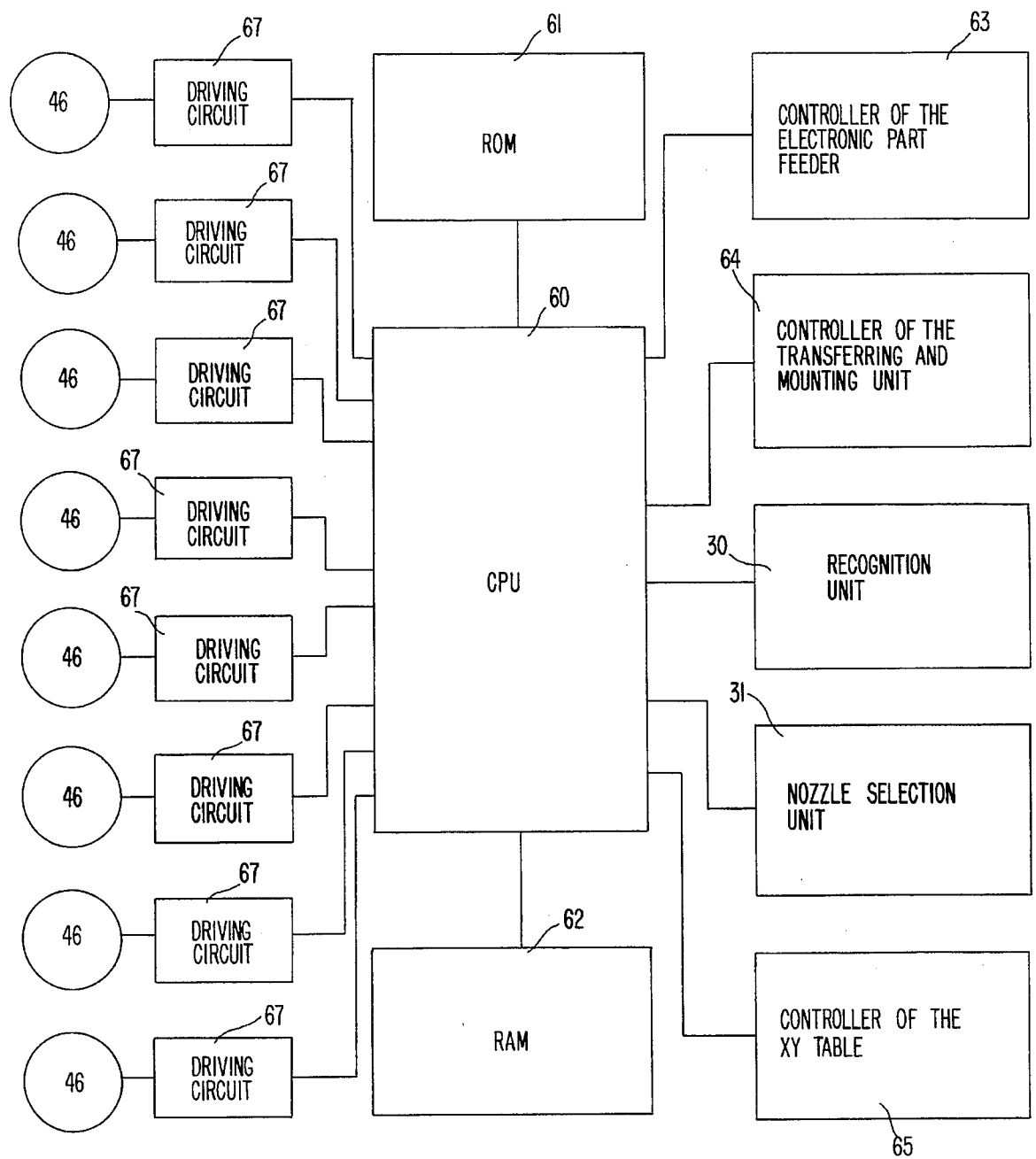
FIG. 5 is a block diagram of the mounting apparatus for electronic parts according to the exemplary embodiment of the present invention.

FIG. 5 is a block diagram of a mounting apparatus of electronic parts according to the exemplary embodiment of the present invention. In FIG. 5, the central processing unit (CPU) 60 controls each of the elements in FIG. 5 according to a control program stored in read only memory (ROM) 61. Random access memory (RAM) 62 stores necessary data for performing the control program including data for feeding electronic parts as shown in FIG. 9.

Controller 63 for the electronic part feeder controls the driving of motor 23 of electronic part feeder 20. Controller 64 for the transferring and mounting unit controls the motor (not shown) for rotating rotary shaft 42 and controls driving cam receiver 51 up and down. Controller 65 for the XY table controls X motor 11 and Y motor 9 to determine the position of substrate 13.

Driving circuit 67 drives the head motor 46. Head motor 46 and driving circuit 67 correspond to the means for rotating the transferring and mounting head. These various controllers or driving circuits act according to instructions from CPU 60 functioning as the control means.

Next, FIG. 7 and FIG. 8 illustrate the operation of the exemplary embodiment with regard to retrieving electronic part P4 from part cassette U4 and then retrieving of electronic part P5 from part cassette U5. In FIG. 7 and FIG. 8, two upward direction arrowheads show first stop position T1 and the second stop position T2.

In FIG. 7, transferring and mounting head 43a is situated at pick up station S4 and transferring and mounting head 43b is situated at pre-pick up station S3.

Transferring and mounting head 43a picks up electronic part P4 from part cassette U4, and then transferring and mounting head 43b picks up electronic part P5 from part cassette U5. In this case, the moving distance of moving table 24 can be shortened by moving the moving table 24 such that part cassette U4 is placed at the first stop position T1 and part cassette U5 is placed at second stop position T2. When part cassette U4 is placed at the first stop position T1 and part cassette U5 is placed at second stop position T2, the pick up operations by transferring and mounting head 43a and transferring and mounting head 43b are performed as shown in FIG. 7 and FIG. 8.

Electronic part P4 is picked up from cassette U4 using an up and down motion of transferring and mounting head 43a from the state shown in FIG. 7. During this period, the transferring and mounting head 43b at pre-pick up station S3 adjusts its attitude to prepare to picking up electronic part P5. Since part cassette U5 is positioned at second stop position T2, transferring and mounting head 43b is rotated by head motor 46 and the position of nozzle 45b is adjusted so nozzle 45 is positioned at second stop position T2 when transferring and mounting head 43b reaches pick up station S4.

The rotary plate 41 is index-rotated as shown in FIG. 8 to move transferring and mounting head 43b to pick up station S4. At pick up position S4, when nozzle 45b of transferring and mounting head 43b and the position of pick up port Q5 of part cassette U5 coincide, transferring and mounting head 43b is moved up and down to pick up electronic part P5.

In the exemplary embodiment above, the moving distance D1 of moving table 24 to move part cassette U5 to the second stop position is determined according to equation (1) below.

$$D1 = t - 2r \tag{1}$$

where t is the interval between part cassettes and r is the radius of rotation circle C2. Since r=t/4 in the exemplary embodiment, D1 is determined according to equation (2) below.

$$D1 = t/2 \tag{2}$$

Accordingly, the moving distance to move the part cassettes is half of the moving distance of a conventional mounting apparatus for electronic parts. Thus the moving time of moving table 24 can be shorten.

Next, the operation of the electronic part feeder 20 based on the electronic part feeding data shown in FIG. 9 will be illustrated with reference to FIG. 3 through FIG. 10.

In FIG. 9, the left column is sequence numbers and the center column is the number of the cassette from which a part is to be retrieved. The number of cassettes are stored in the order that the electronic parts P are feed to the transferring and mounting unit. The right column is stop position data which indicates whether first stop position T1 or second stop position T2 is used. The stop position data is determined using a simulation which is performed to determine the most efficient arrangement of stop positions for mounting of electronic parts on substrate 13.

First, CPU 60 sends a command to controller 64 to move transferring and mounting head 43 which is to pick up electronic part P to nozzle selecting station S2 as indicated by sequence number 1 in FIG. 9.

CPU 60 reads the nozzle selection data (not shown) stored in RAM 62 and sends the command to the nozzle selection unit 31 to select the desired nozzle of transferring and mounting head 43. After the nozzle selection, transferring and mounting head 43 is moved to pre-pick up station S3 by the index rotation of the rotary plate 41. CPU 60 then reads the sequence number column to identify sequence number 1 of the electronic part feeding data stored in RAM 62 and then CPU 60 reads the stop position data of the part cassette corresponding to sequence number 1. In this embodiment, the stop position of part pick up port Q1 of part cassette U1 is first stop position T1.

Accordingly, CPU 60 sends the command to driving circuit 67 of head motor 46 for rotating transferring and mounting head 43 horizontally so that the attitude of transferring and mounting head 43 corresponding to the attitude of first stop position T1. CPU 60 also sends a command to controller 63 for the electronic part feeder unit to position part pick up port Q1 of part cassette U1 at first stop position T1.

Next, transferring and mounting head 43 is moved to pick up station S4 by index rotation of rotary plate 41. At the same time, moving table 24 is moved to position part pick up port Q1 of part cassette U1 at the first stop position T1. Then, when rotary plate 41 and moving table 24 stop, transferring and mounting head 43 is moved up and down to pick up electronic part P1 from part pick up port Q1 of part cassette U1 positioned at the first stop position. Subsequently, transferring and mounting head 43 is successively moved to the pick up miss detecting station S5, electronic part recognizing station S6, electronic part angle compensating station S7 to perform various treatments and operations, and mounting station 58 to mount electronic part P1 on substrate 13.

These operations are performed in parallel by the different transferring and mounting heads 43 so that electronic parts are mounted successively on substrates 13.

Figure 10C:
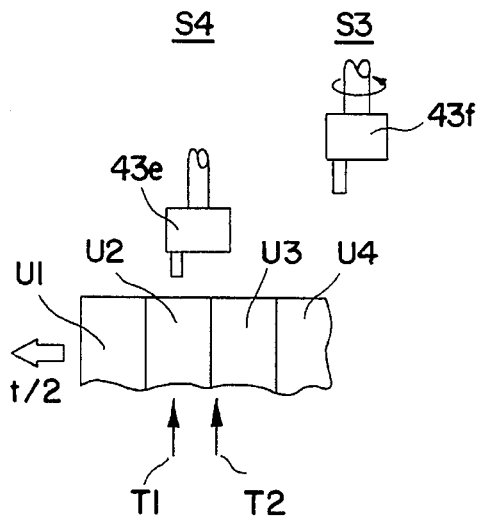
Figure 11:
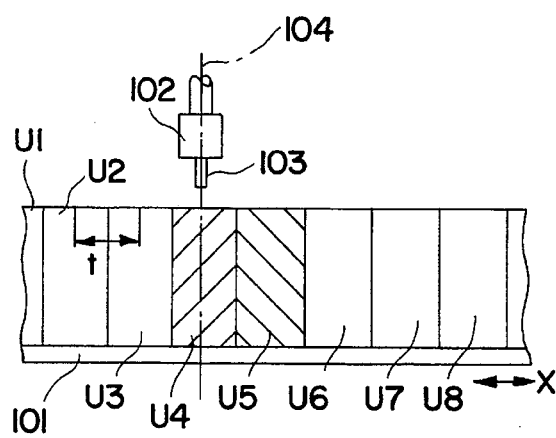
FIG. 11 is an illustrative view of the operation of a conventional mounting apparatus for electronic parts.
Figure 12:
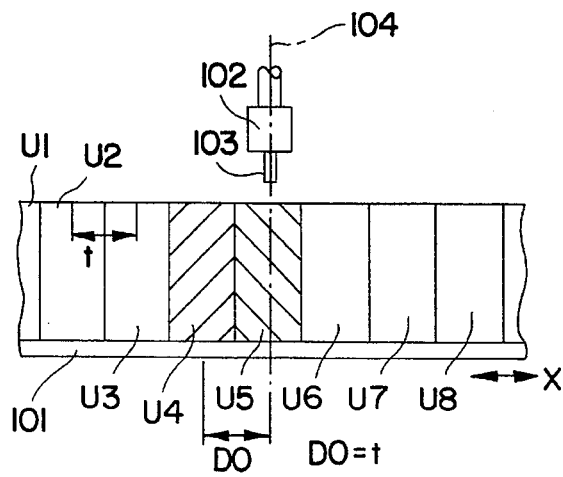
FIG. 12 is an illustrative view of the operation of the conventional mounting apparatus shown in FIG. 11.

FIG. 10(a), 10(b) and 10(c) show the pick up operations according to the electronic part feed data. FIG. 10(a) shows the state when sequence number 1 is performed. FIG. 10(b) shows the state when sequence number 2 is performed. FIG. 10(c) shows the state when sequence number 3 is performed.

First, the part cassette U1 accommodating a first electronic part P1 is positioned at first stop position T1. Thus, transferring and mounting head 43c is moved to pick up station S4 with the attitude shown in FIG. 10(a). Next, as shown in FIG. 10(b), part cassette U2 is moved to the second stop position T2 according to sequence number 2 where electronic part P2 is picked up from part cassette U2 by transferring and mounting head 43d.

Moving distance D1 of part cassette U2 from the position shown in FIG. 10(a) to the second stop position T2 shown in FIG. 10 (b) is determined according to equation (3) below.

$$D1 = 0.5\ t \tag{3}$$

where t is the distances between part cassettes and r is the radius of rotation circle C2. According to sequence number 3, an electronic part is picked up from the same cassette a sequence number 2.

In the subsequent sequence number 5 to pick up electronic part P3 from cassette U3, part cassette U3 is placed as close as possible to the second stop position T2. For this purpose, part cassette U2 is positioned at the first stop position T1 by moving table 24 a distance of 0.5 t in the left direction. Next, as shown in FIG. 10(c), the electronic part P2 is picked up from cassette U2 by transferring and mounting head 43e. In this case, the moving distance D1 of moving table 24 is shortened.

Positioning time of moving table 24 can be shortened because of the shortened moving distance. Accordingly, lowering of the operation speed of the mounting apparatus as a result of the slow operation of the electronic part feeding unit 20 can be avoided.

According to the exemplary embodiment, the moving distance of the moving table is shortened and, thus, the moving time of the electronic part feeding unit can be substantially shortened. As a result, the operation speed of the mounting apparatus can be improved.

In an alternative exemplary embodiment, electronic part feeder and substrate feeder can be positioned on respectively different bases. In addition, the means for horizontally rotating the transferring and mounting head 43, the rotating means of the transferring and mounting head, can be separated from the rotating system of the rotary plate 41.

In another alternative exemplary embodiment, two cassettes can be positioned at the pick up station and the transfer and mounting head can retrieve an electronic part from each cassette at substantially the same time using a nozzle positioned above each cassette.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. Apparatus for picking up components held in a plurality of part cassettes in which said part cassettes are moved along a moving path through a pick up station, said apparatus comprising:

head means having an axis of rotation, nozzle means mounted on the head means wherein the nozzle means moves along a circular path having a center at the axis of rotation, means for moving the head means into and out of the pick up station wherein said moving path and said circular path intersect at a first and at a second intersecting point when said head means is moved to said pick up station, means for positioning one of said part cassettes at a selected position which is selected from said first intersecting point or said second intersecting point, means for rotating said head on said axis to position said nozzle at said selected position, and means for actuating the nozzle means to pick up a component held in one of the part cassettes at said selected position.

2. A method for mounting components on substrates using a) a transferring and mounting head having a pick up nozzle for picking up a component, said transferring and mounting head moving into and out of a pick up station, said transferring and mounting head having a rotating axis for moving said pick up nozzle along a circular path having a center at said rotating axis; and b) a moving table for moving a plurality of part cassettes along a moving path; said circular path of said pick up nozzle and said moving path intersect at two points at a pick up station, wherein said component is retrieved from one of said part cassettes positioned at one of said two intersecting points and the retrieved component is mounted on a substrate positioned at a mounting station, said method comprising the steps of:

(a) rotating said nozzle to a position, said position corresponding to one of said two points when said transferring and mounting head is positioned at said pick up station, (b) moving said transferring and mounting head to said pick up station, (c) positioning one of said part cassettes to said position corresponding to one of said two points where said nozzle is positioned, by moving said moving table, (d) retrieving said component from said part cassette using said nozzle, (e) moving said transferring and mounting head to said mounting station, and (f) mounting said component on said substrate at said mounting station.

3. The method for mounting the plurality of components of claim 2, wherein step (a) is performed by selecting one of said two intersecting points where said nozzle is to be rotated according to stored data identifying said one of the intersecting points where said desired electronic part is to be retrieved.

4. The method for mounting components of claim 2, wherein a plurality of transferring and mounting heads are coupled to a rotary body in a circle, said rotary body having a rotary axis and said circle having a center at said rotary axis, said plurality of transferring and mounting heads are moved from said pick up station to said mounting station by rotating said rotary body around said rotary axis.

5. The method for mounting electronic parts of claim 2, wherein step (a) is completed before step (b).

* * * * *